United States Patent
Sato et al.

(10) Patent No.: US 12,198,911 B2
(45) Date of Patent: *Jan. 14, 2025

(54) NONMAGNETIC MATERIAL-DISPERSED Fe-Pt BASED SPUTTERING TARGET

(71) Applicant: JX Advanced Metals Corporation, Tokyo (JP)

(72) Inventors: Atsushi Sato, Ibaraki (JP); Hideo Takami, Ibaraki (JP); Yuichiro Nakamura, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/145,400

(22) Filed: Dec. 22, 2022

(65) Prior Publication Data

US 2023/0125486 A1  Apr. 27, 2023

Related U.S. Application Data

(62) Division of application No. 16/322,984, filed as application No. PCT/JP2017/031469 on Aug. 31, 2017, now abandoned.

(30) Foreign Application Priority Data

Sep. 2, 2016 (JP) .................................. 2016-172291

(51) Int. Cl.
| | |
|---|---|
| *H01J 37/34* | (2006.01) |
| *B22F 1/05* | (2022.01) |
| *B22F 1/12* | (2022.01) |
| *B22F 3/14* | (2006.01) |
| *B22F 3/15* | (2006.01) |
| *C22C 5/04* | (2006.01) |
| *C22C 33/02* | (2006.01) |
| *C22C 38/00* | (2006.01) |
| *C23C 14/34* | (2006.01) |
| *G11B 5/851* | (2006.01) |
| *H01F 41/18* | (2006.01) |

(52) U.S. Cl.
CPC .......... *H01J 37/3429* (2013.01); *C22C 5/04* (2013.01); *C22C 33/02* (2013.01); *C23C 14/3414* (2013.01); *H01F 41/183* (2013.01); *H01J 37/3491* (2013.01); *B22F 1/05* (2022.01); *B22F 1/12* (2022.01); *B22F 3/14* (2013.01); *B22F 3/15* (2013.01); *B22F 2304/10* (2013.01); *C22C 38/00* (2013.01); *G11B 5/851* (2013.01)

(58) Field of Classification Search
CPC ............. H01J 37/3429; H01J 37/3491; C23C 14/3414; C22C 5/04; C22C 38/00; C22C 33/02; G11B 5/851; H01F 41/183; B22F 1/05; B22F 1/12; B22F 3/14; B22F 3/15; B22F 2304/10

See application file for complete search history.

(56) References Cited

U.S. PATENT DOCUMENTS

| | | |
|---|---|---|
| 5,522,948 A | 6/1996 | Sawa |
| 2002/0041980 A1 | 4/2002 | Suzuki et al. |
| 2008/0057350 A1 | 3/2008 | Das et al. |
| 2013/0084387 A1 | 4/2013 | Hellwig et al. |
| 2014/0301887 A1 | 10/2014 | Miyashita et al. |
| 2015/0107991 A1 | 4/2015 | Sato |

(Continued)

FOREIGN PATENT DOCUMENTS

| | | |
|---|---|---|
| JP | 2002-123920 A | 4/2002 |
| JP | 2003-313659 A | 11/2003 |
| JP | 2008-059733 A | 3/2008 |

(Continued)

OTHER PUBLICATIONS

Machine Translation WO 2014185266 (Year: 2014).*

(Continued)

*Primary Examiner* — Michael A Band
(74) *Attorney, Agent, or Firm* — MARSHALL, GERSTEIN & BORUN LLP

(57) ABSTRACT

Provided is a sputtering target which can lower a heat treatment temperature for ordering a Fe—Pt magnetic phase and can suppress generation of particles during sputtering. The sputtering target is a nonmagnetic material-dispersed sputtering target containing Fe, Pt and Ge. The sputtering target includes at least one magnetic phase satisfying a composition represented by $(Fe_{1-\alpha}Pt_\alpha)_{1-\beta}Ge_\beta$, as expressed in an atomic ratio for Fe, Pt and Ge, in which $\alpha$ and $\beta$ represent numbers meeting $0.35 \le \alpha \le 0.55$ and $0.05 \le \beta \le 0.2$, respectively. The magnetic phase has a ratio ($S_{Ge30mass\%}/S_{Ge}$) of 0.5 or less. The ratio ($S_{Ge30mass\%}/S_{Ge}$) is an average area ratio of Ge-based alloy phases containing a Ge concentration of 30% by mass or more ($S_{Ge30mass\%}$) to an area ratio of Ge ($S_{Ge}$) calculated from the entire composition of the sputtering target, in element mapping by EPMA of a polished surface obtained by polishing a cross section perpendicular to a sputtering surface of the sputtering target.

9 Claims, No Drawings

(56) References Cited

U.S. PATENT DOCUMENTS

2015/0213821 A1 7/2015 Ono et al.
2019/0185987 A1* 6/2019 Sato ..................... C22C 1/0466

FOREIGN PATENT DOCUMENTS

| | | | |
|---|---|---|---|
| JP | 2011-208265 A | 10/2011 | |
| JP | 2012-214874 A | 11/2012 | |
| JP | 2013/077370 A | 4/2013 | |
| JP | 2015/175025 A | 10/2015 | |
| JP | 2016/166404 A | 9/2016 | |
| WO | WO-2014/064995 A1 | 5/2014 | |
| WO | WO-2014/087665 A1 | 6/2014 | |
| WO | WO-2014171161 A1 * | 10/2014 | ........... C22C 1/0466 |
| WO | WO-2014/185266 A1 | 11/2014 | |
| WO | WO-2014/188916 A1 | 11/2014 | |
| WO | WO-2014/196377 A1 | 12/2014 | |

OTHER PUBLICATIONS

Machine Translation JPWO2014171161, equivalent to WO 2014171161 (Year: 2014).*
Search Report and Written Opinion in International Application No. PCT/JP2017/031469 dated Nov. 21, 2017, 4 pages.
Mitsuo Shinke ed.: Foundation and Application of Organization/Characteristic Analysis of 3D Material, Appendix A1, Uchida Rokakuho Publishing Co., Ltd., Jun. 2014, 5 pages.
International Preliminary Report on Patentability in International Application No. PCT/JP2017/031469 dated Mar. 14, 2019, 9 pages.

* cited by examiner

NONMAGNETIC MATERIAL-DISPERSED Fe-Pt BASED SPUTTERING TARGET

CROSS-REFERENCE TO RELATED APPLICATIONS

This application is a divisional of U.S. application Ser. No. 16/322,984 filed Feb. 4, 2019, which is the U.S. national stage of PCT/JP2017/031469 filed Aug. 31, 2017, which claims the priority benefit of JP Application No. 2016-172291 filed Sep. 2, 2016, the respective disclosures of which are hereby incorporated by reference in their entirety for all purposes herein.

TECHNICAL FIELD

The present invention relates to a nonmagnetic material-dispersed Fe—Pt based sputtering target suitable for forming a magnetic thin film in a magnetic recording medium.

BACKGROUND ART

In the field of magnetic recording represented by hard disk drives, materials based on Co, Fe or Ni, which is a ferromagnetic metal, are used as materials of magnetic thin films responsible for recording. For example, Co—Cr based or Co—Cr—Pt based ferromagnetic alloys containing Co as a main component have been used for recording layers of hard disks employing a longitudinal magnetic recording system. Further, composite materials in which nonmagnetic particles such as oxide and carbon are dispersed in the Co—Cr—Pt-based ferromagnetic alloy containing Co as a main component are widely used for recording layers of hard disks employing a perpendicular magnetic recording system which has been recently put into practical use. The magnetic thin films are often produced by sputtering the sputtering targets containing the above materials using a DC magnetron sputtering apparatus, in terms of high productivity.

On the other hand, recording density of hard disks is rapidly increasing every year, and the hard disks having a capacity exceeding 1 Tbit/in$^2$ have been commercially available. When the recording density reaches 1 Tbit/in$^2$, the size of the recorded bit will be lower than 10 nm. In this case, there would be a problem of superparamagnetization due to thermal fluctuation, which would not be sufficiently addressed by the currently used materials of the magnetic recording media, for example those which have improved crystal magnetic anisotropy obtained by adding Pt to the Co—Cr based alloy, because the magnetic grains that stably act as ferromagnets in a size of 10 nm or less should have higher crystal magnetic anisotropy.

For the reasons as described above, a Fe—Pt magnetic phase possessing a $L1_0$ structure is attracting attention as a material for ultrahigh density recording media. The Fe—Pt magnetic phase possessing the $L1_0$ structure is expected to be a material that is suitable for application of magnetic recording media, because the Fe—Pt magnetic phase has higher crystalline magnetic anisotropy as well as improved corrosion resistance and oxidation resistance. When the Fe—Pt magnetic phase is used as the material for the ultrahigh density recording media, there is a need for development of technique for dispersing ordered Fe—Pt magnetic grains as dense as possible with uniform orientation, while magnetically isolating the ordered Fe—Pt magnetic grains.

Therefore, granular structure magnetic thin films in which the Fe—Pt magnetic phase possessing the $L1_0$ structure is isolated by nonmagnetic materials such as oxide, nitride, carbide and carbon have been proposed for magnetic recording media of next generation hard disks employing a thermally assisted magnetic recording system. The granular structure magnetic thin film includes a structure in which the magnetic particles are magnetically insulated from each other by interposition of nonmagnetic materials.

The granular structure magnetic thin film having the Fe—Pt magnetic phase is generally produced using a Fe—Pt based sputtering target. When the Fe—Pt film is formed by the sputtering method, Fe atoms and Pt atoms are randomly arranged to form irregular phases. Conventionally, in order to form an ordered Fe—Pt magnetic phase, a heating treatment (annealing) at about 600° C. is required after forming the film. However, it is desirable that the temperature of the heat treatment can be decreased as low as possible, from the viewpoint of practicality. In this regard, Patent Document 1 discloses that an amount of a residual gas component represented by an amount of residual oxygen is reduced in order to lower an annealing temperature required for ordering a film of an alloy such as a Fe—Pt alloy. However, when utilizing an oxide, a carbide, a nitride or the like as a nonmagnetic material, it is not easy to control the amount of the gas component.

Patent Document 2 discloses a method in which an Fe—Pt layer is deposited by a sputtering method, a sealing layer is then deposited on the Fe—Pt layer, annealing is then performed in a temperature range of from 400 to 800° C. to substantially obtain ordered Fe—Pt having a $L1_0$ phase, and the sealing layer is then removed. However, the method is intended to enable high temperature annealing, but it is not a technique for lowering the annealing temperature for ordering the Fe—Pt magnetic phase.

Patent Document 3 discloses that an $L1_0$ type ordered alloy mixture thin film with added MgO can be produced at a lower film formation temperature than a mixture thin film with added $SiO_2$ or $Al_2O_3$. However, the art merely indicates that a heating temperature of a substrate during film formation is relatively low when MgO is added, and is not intended to lower the ordering temperature.

Each of Patent documents 4 and 5 describes an invention relating to a sputtering target for Fe—Pt based magnetic recording media. These inventions have been filed by the applicant of the present invention, and are excellent in that they can effectively suppress generation of particles due to detachment of carbon contained as a nonmagnetic material during sputtering. However, they do not mention the lowering of the ordering temperature.

Furthermore, Patent Documents 6 and 7 also disclose Fe—Pt based sputtering targets and magnetic recording media, but they do not mention the lowering of the ordering temperature.

Under such circumstances, the applicant of the present invention has filed a patent application (Japanese Patent Application No. 2015-042309) which is not yet published at this moment. This application discloses a Fe—Pt based sputtering target to which Ge is added at a predetermined ratio because Ge is advantageous for lowering the ordering temperature.

CITATION LIST

Patent Document 1: Japanese Patent Application Publication No. 2003-313659 A

Patent Document 2: Japanese Patent Application Publication No. 2013-77370 A

Patent Document 3: Japanese Patent Application Publication No. 2002-123920 A
Patent Document 4: WO 2014/196377 A1
Patent Document 5: WO 2014/188916 A1
Patent Document 6: Japanese Patent Application Publication No. 2008-59733 A
Patent Document 7: Japanese Patent Application Publication No. 2012-214874 A
Patent Document 8: Japanese Patent Application No. 2015-042309 (unpublished prior application)

SUMMARY OF INVENTION

Technical Problem

The technique described in Japanese Patent Application No. 2015-042309 is useful in that it is possible to obtain a sputtering target capable of lowering the heat treatment temperature for ordering the Fe—Pt magnetic phase. However, the technique described in the document causes a problem that particles tend to be generated during sputtering. It is desirable to minimize the particles in terms of quality stability of the sputtered film.

The present invention has been made in view of the above circumstances. An object of the present invention is to provide a sputtering target which can lower the heat treatment temperature for ordering the Fe—Pt magnetic phase, and which can suppress generation of particles during sputtering.

Solution to Problem

As a result of intensive studies to solve the above problems, the present inventors have found that a sputtering target obtained by sintering Ge powder as a raw material tends to generate nodules in Ge grain portions having lower conductivity than Fe—Pt alloy and cause the particles. The present inventors then have found that a sputtering target obtained by sintering alloy powder of Pt and Ge (hereinafter referred to as "Pt—Ge alloy powder") or alloy powder of Pt, Ge and Fe (hereinafter referred to as "Pt—Ge—Fe alloy powder"), rather than the Ge powder, as a raw material, can suppress generation of the nodules during sputtering and also generation of the particles. Analysis of the magnetic phase of such sputtering target by EPMA has revealed that an area ratio of the Ge-based alloy phase having a Ge concentration of 30% by mass or more has been extremely decreased. The present invention has been completed based on such findings.

In one aspect, the present invention relates to a nonmagnetic material-dispersed sputtering target containing Fe, Pt and Ge, the sputtering target comprising at least one magnetic phase satisfying a composition represented by $(Fe_{1-\alpha}Pt_{\alpha})_{1-\beta}Ge_{\beta}$ in an atomic ratio for Fe, Pt and Ge, in which $\alpha$ and $\beta$ represent numbers meeting $0.35 \leq \alpha \leq 0.55$ and $0.05 \leq \beta \leq 0.2$, respectively; wherein the magnetic phase satisfies a ratio $(S_{Ge30mass\%}/S_{Ge})$ of 0.5 or less, the ratio $(S_{Ge30mass\%}/S_{Ge})$ being a proportion of an average area ratio of Ge-based alloy phases containing Ge at a concentration of 30% by mass or more $(S_{Ge30mass\%})$ to an area ratio of Ge $(S_{Ge})$ calculated from an entire composition of the sputtering target, in element mapping by EPMA of a polished surface obtained by polishing a cross section perpendicular to a sputtering surface of the sputtering target.

In one embodiment of the sputtering target according to the present invention, the nonmagnetic material comprises one or more selected from a group consisting of carbon, carbide, oxide and nitride, and wherein the nonmagnetic material accounts for a volume fraction of from 10 to 60 vol % based on a total volume of the sputtering target.

In another embodiment of the sputtering target according to the present invention, the sputtering target comprises one or more third elements selected from a group consisting of Au, B, Co, Cr, Cu, Mn, Mo, Nb, Ni, Pd, Re, Rh, Ru, Sn, Ta, W, V and Zn, in an amount of 10 at. % or less as expressed by a ratio of a total number of atoms of the third element(s) to a total number of atoms of Fe, Ge and Pt.

In yet another embodiment of the sputtering target according to the present invention, the sputtering target has an oxygen concentration of 400 ppm by mass or less.

In another aspect, the present invention relates to a method for producing the sputtering target according to the present invention, comprising steps of:
mixing Pt—Ge alloy powder and/or Pt—Ge—Fe alloy powder, metal powder other than the Pt—Ge alloy powder and the Pt—Ge—Fe alloy powder, and nonmagnetic material powder while pulverizing them in an inert gas atmosphere to obtain a mixed powder, such that Fe, Pt and Ge satisfy a composition represented by $(Fe_{1-\alpha}Pt_{\alpha})_{1-\beta}Ge_{\beta}$ in an atomic ratio for Fe, Pt and Ge, in which $\alpha$ and $\beta$ represent numbers meeting $0.35 \leq \alpha \leq 0.55$ and $0.05 \leq \beta \leq 0.2$, respectively;
sintering the mixed powder obtained in the above step by a pressure sintering method at a temperature of less than a melting point of the Pt—Ge alloy powder in a vacuum atmosphere or an inert gas atmosphere to obtain a sintered compact; and
shaping the sintered compact.

In one embodiment of the method for producing the sputtering target according to the present invention, the Pt—Ge alloy powder and/or Pt—Ge—Fe alloy powder has an average particle diameter of from 1 to 50 µm before the mixing step.

In another embodiment of the method for producing the sputtering target according to the present invention, when using the Pt—Ge alloy powder, the Pt—Ge alloy powder before the mixing step comprises a composition Pt:Ge=1:0.8 to 1.2 in an atomic ratio.

In yet another embodiment of the method for producing the sputtering target according to the present invention, when using the Pt—Ge—Fe alloy powder, the Pt—Ge—Fe alloy powder before the mixing step comprises a composition Pt:Ge:Fe=1:0.8 to 1.2:0.1 to 0.3 in an atomic ratio.

In yet another embodiment of the method for producing the sputtering target according to the present invention, the method comprises pressurizing the mixed powder at a pressure in a range of from 20 to 70 MPa during the sintering.

In yet another embodiment of the method for producing the sputtering target according to the present invention, the mixed powder obtained by the step of mixing the powders while pulverizing them has an average particle diameter of 20 µm or less.

Advantageous Effects of Invention

According to the present invention, it is possible to provide a sputtering target which can lower the heat treatment temperature for ordering the Fe—Pt magnetic phase and can suppress generation of nodules and particles during sputtering. The use of the sputtering target according to the present invention can provide advantageous effects that a granular-structured magnetic thin film containing the Fe—Pt magnetic phase can be industrially produced at a lower cost and in a short period of time.

DESCRIPTION OF THE PREFERRED EMBODIMENTS (Metal Phase)

The nonmagnetic material-dispersed sputtering target containing Fe, Pt and Ge according to the present invention has at least one magnetic phase containing Fe, Pt and Ge. The magnetic phase satisfies a composition represented by $(Fe_{1-\alpha}Pt_{\alpha})_{1-\beta}Ge_{\beta}$ in an atomic ratio for Fe, Pt and Ge, in which $\alpha$ and $\beta$ represent numbers meeting $0.35 \leq \alpha \leq 0.55$, and $0.05 \leq \beta \leq 0.2$, respectively, in element mapping by EPMA of a polished surface obtained by polishing a cross section perpendicular to a sputtering surface of the sputtering target. In addition to Fe, Pt and Ge, the magnetic phase can contain a third element(s) which will be described below.

The value of $\alpha$ of 0.35 or more provides an advantage that the magnetic phase takes the form of an ordered alloy phase. The value of $\alpha$ may preferably be 0.4 or more, and more preferably 0.45 or more. Further, the value of $\alpha$ of 0.55 or less also provides an advantage that the magnetic phase takes the form of an ordered alloy phase. The value of $\alpha$ may preferably be 0.53 or less, and more preferably 0.52 or less.

The value of $\beta$ of 0.05 or more can significantly develop the effect of lowering the ordering temperature. The value of $\beta$ may preferably be 0.06 or more, and more preferably 0.07 or more. Further, the value of $\beta$ of 0.2 or less provides an advantage of capable of sufficiently obtaining magnetic characteristics as a magnetic thin film. The value of $\beta$ may preferably be 0.15 or less, and more preferably 0.12 or less.

It is advantageous that the magnetic phase satisfies a ratio $(S_{Ge30mass\%}/S_{Ge})$ of 0.5 or less, the ratio being a proportion of an average area ratio of Ge-based alloy phases containing Ge at a concentration of 30% by mass or more $(S_{Ge30mass\%})$ to an area ratio of Ge $(S_{Ge})$ calculated from the entire composition of the sputtering target. This means that there are very few regions having high concentration of Ge in the magnetic phase. This can make it difficult for nodules to be generated during sputtering, thereby suppressing generation of particles. The ratio of the Ge-based alloy phase $(S_{Ge30mass\%}/S_{Ge})$ may preferably be 0.5 or less, and more preferably 0.3 or less, and still more preferably 0.2 or less, for example from 0 to 0.2.

In the present invention, the ratio $S_{Ge30mass\%}/S_{Ge}$ in the magnetic phase is measured by the following method. A cross section perpendicular to the sputtering surface of the sputtering target is cut out, and the cross section is polished using coated abrasives with counts from P80 to P2000 in order, and finally buffed using aluminum oxide abrasive grains with a grain size of 0.3 µm to obtain a cross-section polished surface. The polished surface is subjected to element mapping using an EPMA (electron beam microanalyzer) under the following conditions, and the area ratio of the region having a Ge concentration of 30% by mass or more is examined. Observation conditions of the EPMA are as follows: an acceleration voltage of 15 kV, an irradiation current of 1 to $2 \times 10^{-7}$ A; a plurality of element mapping images of 256×256 pixels (measurement time at 1 point of 1 msec) are acquired with an observation magnification of 2500 in different observation fields of view. By the element mapping, monochrome or color images are obtained depending on X-ray detection intensity for specific elements. The X-ray intensity map is then converted to a mass concentration map using analysis function associated with the EPMA. The conversion is performed using a calibration curve (linear function) that correlates the X-ray detection intensity with the element concentration, which have been prepared by measuring standard samples of the respective elements. Using the converted mass concentration map, an average of the area ratios $(S_{Ge30mass\%})$ of the regions having the Ge concentration of 30% by mass or more is determined. On the other hand, the composition of the target is analyzed by an ICP-AES apparatus. From results of the composition analysis, the area ratio of Ge $(S_{Ge})$ is determined utilizing a mass ratio of each target component and a density of each component. In such a way, the ratio of $S_{Ge30mass\%}/S_{Ge})$ is calculated.

(Third Element)

The sputtering target according to the present invention may contain one or more third elements selected from the group consisting of Au, B, Co, Cr, Cu, Mn, Mo, Nb, Ni, Pd, Re, Rh, Ru, Sn, Ta, W, V and Zn. As with Ge, these third elements provide the effect of lowering the heat treatment temperature for ordering the Fe—Pt magnetic phase, and are permissible to use them in combination with Ge. The sputtering target may contain the third element(s), in an amount of 10 at. % or less, or 5 at. % or less, or 1 at. % or less, as expressed by a ratio of the total number of atoms of the third element(s) to the total number of atoms of Fe, Ge and Pt.

(Nonmagnetic Material)

The sputtering target according to the present invention may contain one or more selected from the group consisting of carbon, carbide, oxide and nitride, as a nonmagnetic material. The nonmagnetic material can be dispersed as nonmagnetic material phases that are distinguishable from the magnetic phase in the sputtering target. Examples of the carbide include carbide of one or more elements selected from the group consisting of B, Ca, Nb, Si, Ta, Ti, W and Zr. Examples of the oxide include oxide of one or more elements selected from the group consisting of Al, B, Ba, Be, Ca, Ce, Cr, Dy, Er, Eu, Ga, Gd, Ho, Li, Mg, Mn, Nb, Nd, Pr, Sc, Si, Sm, Sr, Ta, Tb, Ti, V, Y, Zn and Zr. Examples of the nitride include nitride of one or more elements selected from the group consisting of Al, B, Ca, Nb, Si, Ta, Ti and Zr.

The magnetic thin film produced by the sputtering target according to the present invention includes a structure in which the carbon, carbide, nitride and oxide insulate magnetic interaction between the magnetic phases, and is thus expected to have good magnetic properties. The amount of the nonmagnetic material incorporated is not particularly limited as long as it is within a range that is capable of maintaining properties required for magnetic recording media, but it may preferably be 10 vol. % or more, and more preferably 20 vol. % or more, and even more preferably 25 vol. % or more, based on the entre volume of the sputtering target, in terms of effectively exerting the effect of insulating the magnetic interaction. On the other hand, an increased ratio of the nonmagnetic material will not only decrease conductivity of the target so that DC sputtering will be difficult, but also cause generation of particles. Therefore, the amount of the nonmagnetic material incorporated may preferably be 60 vol. % or less, and more preferably 50 vol. % or less, and even more preferably 40 vol. % or less, in terms of ensuring productivity. The volume fraction of the nonmagnetic material can be determined by calculating a mass ratio from the atomic ratio and atomic weight of each element forming the target and using the mass ratio and the density of each element.

(Relative Density)

The relative density of the sputtering target according to the present invention may preferably be 90% or more, and more preferably 93% or more, and still more preferably 95% or more. Increase of the density enhances the uniformity of the sputtered film and contributes to suppression of particles that will be generated during sputtering. The sputtering target with high density (sintered compact) can be obtained by combining conditions such as a decrease in the particle diameter of the raw material powder, sufficient mixing of the raw material powder, pressurizing conditions at a high temperature provided by hot pressing or hot isostatic pressing sintering during the production of the sintered body, and the like. The relative density of the sputtering target is calculated from the equation: (actual density/theoretical density)×100(%), which is a ratio of the actual density measured by the Archimedes method in water to the theoretical density.

The calculation of the theoretical density was carried out using the following equation:

theoretical density=Σ(molecular weight of component×molar ratio of component)/Σ(molecular weight of component×molar ratio of component/density in literature value of component). Equation:

Here, the Σ (sigma) means that all the components of the target are summed.

The density (literature values) of each component is illustrated below:

Fe: 7.874 (g/cm$^3$), Pt: 21.45 (g/cm$^3$), Ge: 5.323 (g/cm$^3$), C (graphite): 2.260 (g/cm$^3$), C (amorphous carbon): 1.95 (g/cm$^3$), C (diamond): 3.51 (g/cm$^3$), Au: 19.3 (g/cm$^3$), B: 2.34 (g/cm$^3$), Co: 8.9 (g/cm$^3$), Cr: 7.188 (g/cm$^3$), Cu: 8.93 (g/cm$^3$), Mn: 7.42 (g/cm$^3$), Mo: 10.2 (g/cm$^3$), Nb: 8.57 (g/cm$^3$), Ni: 8.85 (g/cm$^3$), Pd: 12.02 (g/cm$^3$), Re: 21.02 (g/cm$^3$), Rh: 12.41 (g/cm$^3$), Ru: 12.06 (g/cm$^3$), Sn: 7.28 (g/cm$^3$), Ta: 16.6 (g/cm$^3$), W: 19.3 (g/cm$^3$), V: 5.98 (g/cm$^3$), Zn: 7.14 (g/cm$^3$), $Al_2O_3$: 3.9 (g/cm$^3$), $B_2O_3$: 1.84 (g/cm$^3$), BaO: 5.06 (g/cm$^3$), CaO: 3.37 (g/cm$^3$), $CeO_2$: 7.13 (g/cm$^3$), $Cr_2O_3$: 5.21 (g/cm$^3$), $Dy_2O_3$: 7.81 (g/cm$^3$), $Er_2O_3$: 8.64 (g/cm$^3$), $Eu_2O_3$: 7.42 (g/cm$^3$), $Ga_2O_3$: 6.44 (g/cm$^3$), $Gd_2O_3$: 7.4 (g/cm$^3$), $Ho_2O_3$: 8.36 (g/cm$^3$), $Li_2O$: 2.013 (g/cm$^3$), MgO: 3.65 (g/cm$^3$), MnO: 5.43 (g/cm$^3$), $Nb_2O_5$: 4.6 (g/cm$^3$), $Nd_2O_3$: 7.24 (g/cm$^3$), $Pr_2O_3$: 6.88 (g/cm$^3$), $Sc_2O_3$: 3.864 (g/cm$^3$), $SiO_2$ (amorphous): 2.2 (g/cm$^3$), $SiO_2$ (quartz): 2.7 (g/cm$^3$), $Sm_2O_3$: 7.43 (g/cm$^3$), SrO: 4.7 (g/cm$^3$), $Ta_2O_5$: 8.73 (g/cm$^3$), $Tb_4O_7$: 7.8 (g/cm$^3$), $TiO_2$: 4.26 (g/cm$^3$), $V_2O_3$: 4.87 (g/cm$^3$), $Y_2O_3$: 5.03 (g/cm$^3$), ZnO: 5.6 (g/cm$^3$), $ZrO_2$: 5.49 (g/cm$^3$), BaC: 2.51 (g/cm$^3$), $CaC_2$: 2.22 (g/cm$^3$), NbC: 7.82 (g/cm$^3$), SiC: 3.21 (g/cm$^3$), TaC: 14.65 (g/cm$^3$), TiC: 4.93 (g/cm$^3$), WC: 15.7 (g/cm$^3$), ZrC: 6.73 (g/cm$^3$), AlN: 3.26 (g/cm$^3$), BN: 2.27 (g/cm$^3$), NbN: 8.31 (g/cm$^3$), $Si_3N_4$: 3.44 (g/cm$^3$), TaN: 14.36 (g/cm$^3$), TiN: 5.43 (g/cm$^3$), and ZrN: 7.35 (g/cm$^3$).

(Oxygen Concentration)

In one embodiment, the sputtering target according to the present invention has an oxygen concentration of 400 ppm by mass or less. The low oxygen concentration provides an advantage that ordering tends to proceed. The oxygen concentration may preferably be 300 ppm by mass or less, and more preferably 250 ppm by mass or less, for example from 200 to 400 ppm by mass. In the present invention, the oxygen concentration is measured by an oxygen analyzer employing an inert gas fusion-infrared absorption method.

(Production Method)

The sputtering target according to the present invention can be produced by means of a powder sintering method, for example, by the following method. First, as metal powder, Fe powder, Pt—Ge alloy powder, Pt—Ge—Fe alloy powder, Pt powder and optionally third element powder and the like are prepared. It is important for Ge to use the Pt—Ge alloy powder (alloy powder of Pt and Ge) or the Pt—Ge—Fe alloy powder (alloy powder of Pt, Ge and Fe) as a raw material. The Pt—Ge alloy powder and the Pt—Ge—Fe alloy powder may be used in combination. This leads to a very smaller area ratio of the Ge-based alloy phase having the Ge concentration of 30% by mass or more in the magnetic phase forming the target. As a result, the resulting sputtering target can suppress generation of nodules during sputtering, and also suppress generation of particles. On the other hand, the sintering of the Ge powder alone as a raw material powder leads to a larger area ratio of the Ge-based alloy phase having the Ge concentration of 30% by mass or more in the magnetic phase forming the target, so that nodules are easily generated and an amount of the particles is also increased. In general, the use of metal raw material powder having a small particle size leads to an increased amount of oxygen in the target due to the effect of the oxidation of the surface of the powder. However, it is possible to suppress the oxidation of Ge by preparing the alloy powder of Pt—Ge and/or Pt—Ge—Fe in advance. It is also possible to use atomized powder of Pt—Ge—Fe as the metal powder. In this case, there is an advantage that Ge can be uniformly dispersed in the magnetic phase.

The Pt—Ge alloy powder or the Pt—Ge—Fe alloy powder may be prepared by pulverizing an ingot obtained by melting and casting, or may be prepared as atomized powder. In view of pulverization, the composition of the Pt—Ge alloy powder may preferably be Pt:Ge=1:0.8 to 1.2, and more preferably Pt:Ge=1:0.9 to 1.1, and still more preferably Pt:Ge=1:0.95 to 1.105, as expressed in an atomic ratio. In view of pulverization, the composition of the Pt—Ge—Fe alloy powder may preferably be Pt:Ge:Fe=1:0.8 to 1.2:0.1 to 0.3, and more preferably Pt:Ge:Fe=1:0.8 to 1.2:0.1 to 0.2, and even more preferably Pt:Ge:Fe=1:0.9 to 1.1:0.1 to 0.2, as expressed in an atomic ratio. Each of the Pt—Ge alloy powder and the Pt—Ge—Fe alloy powder may preferably have an average particle diameter of 50 μm or less, and more preferably 30 μm or less, and even more preferably 20 μm or less, for the reason of eliminating a variation in the composition of the target. Each of the Pt—Ge alloy powder and the Pt—Ge—Fe alloy powder may preferably have an average particle diameter of 1 μm or more, and more preferably 2 μm or more, and more preferably 4 μm or more, in terms of suppressing a composition change due to oxidation of these alloy powders.

As a metal other than Ge, powder of a single metal may be used, or alloy powder may be used. The alloy powder may be produced by pulverizing an ingot obtained by melting and casting, or it may be prepared as atomized powder. In terms of enabling uniform dispersion of the nonmagnetic material and preventing segregation and crystal coarsening, the powder of the metal other than Ge may preferably have an average particle diameter of 30 μm or less, and more preferably 20 μm or less, even more preferably 10 μm or less. Further, in terms of suppressing a change in composition due to oxidation of the metal powder, the powder of the metal other than Ge may have preferably an average particle diameter of 1 μm or more, and more preferably 2 μm or more, and still more preferably 4 μm or more.

Carbon powder, carbide powder, nitride powder, oxide powder, and the like may be prepared as powder of nonmagnetic material. As for the carbon powder among the nonmagnetic materials, it includes one having a crystal structure such as graphite and nanotube and an amorphous one represented by carbon black. Either of the carbon powders may be used. From the viewpoint that the nonmagnetic material powder is easily dispersed uniformly, the average particle size may preferably be 30 µm or less, and more preferably 10 µm or less, and still more preferably 5 µm or less. In addition, from the viewpoint of preventing aggregation of the powders, the average particle diameter of the nonmagnetic material powder may preferably be 0.1 µm or more, and more preferably 1 µm or more, and still more preferably 2 µm or more.

In the present invention, the average particle diameter of the metal powder and the nonmagnetic material means a particle diameter at a cumulative value of 50% (D50) on volume value basis in the particle size distribution determined by a laser diffraction/scattering method. In Examples, the average particle diameter is measured by dispersing the powder in an ethanol solvent and using a particle size distribution measuring device, model LA-920 available from HORIBA, Ltd. As a refractive index, the value of metal cobalt is used.

Next, the raw material powder (metal powder and nonmagnetic material powder) is weighed so as to have a desired composition and mixed together and pulverized using a known method such as a ball mill. In this case, it is preferable to suppress the oxidation of the raw material powder as much as possible by encapsulating an inert gas in the pulverizing container. Examples of the inert gas include Ar gas and $N_2$ gas. Further, in this case, the powder may be preferably ground until the average particle diameter of the mixed powder is 20 µm or less, and more preferably to 10 µm or less, for example from 0.1 to 10 µm, in order to achieve a uniform structure. The mixed powder thus obtained is molded and sintered by a hot pressing method in a vacuum atmosphere or an inert gas atmosphere. In addition to the hot pressing method, various pressure sintering methods such as a plasma discharge sintering method may be used. In particular, a hot isostatic pressing and sintering method (HIP) is effective for improving the density of the sintered compact, and the hot pressing method and the hot isostatic pressing and sintering method may be preferably carried out in this order, in terms of improving the density of the sintered compact.

The retention temperature during the sintering depends on the composition of the magnetic phase to avoid melting of metal powder. It may be preferably less than the melting point(s) of the Pt—Ge alloy and/or the Pt—Fe—Ge alloy, more preferably at least 20° C. lower than the melting point(s), and even more preferably at least 50° C. lower than the melting point. For example, for the Pt—Ge alloy having an atomic ratio of Pt and Ge of 1:1, the retention temperature may preferably be 1070° C. or lower, and more preferably 950° C. or lower, and even more preferably 850° C. or lower. Further, the retention temperature during the sintering may preferably be 650° C. or higher, and more preferably 700° C. or higher, and even more preferably 750° C. or higher, in order to avoid a decrease in the density of the sintered compact.

The pressing pressure during the sintering may preferably be 20 MPa or more, and more preferably 25 MPa or more, and still more preferably 30 MPa or more, in order to facilitate the sintering. The pressing pressure during the sintering may preferably be 70 MPa or less, and more preferably 50 MPa or less, and still more preferably 40 MPa or less, in view of the strength of the dies.

The duration of time of the sintering may preferably be 0.3 hours or more, and more preferably 0.5 hours or more, and still more preferably 1.0 hours or more, in order to improve the density of the sintered compact. The duration of time of the sintering may preferably be 3.0 hours or less, and more preferably 2.0 hours or less, and still more preferably 1.5 hours or less, in order to prevent coarsening of crystal grains.

The resulting sintered compact may be shaped into a desired shape using a lathe or the like to provide the sputtering target according to the present invention. The shape of the target includes, but not particularly limited to, a flat plate shape (including a disk shape and a rectangular plate shape) and a cylindrical shape, for example. The sputtering target according to the present invention is particularly useful as a sputtering target used for forming a granular structure magnetic thin film.

Examples

Hereinafter, examples of the present invention will be described together with comparative examples for better understanding of the present invention and its advantage, but the present invention is not limited to these examples.

<Preparation of Sputtering Target>

Fe powder, Pt—Ge alloy powder (or Pt—Ge—Fe alloy powder), Pt powder and graphite powder (C) as a nonmagnetic material, each having the average particle diameter as shown in Table 1 according to the test examples, were prepared as raw material powder, and weighed such that the total mass was 2200 g in the atomic ratio as shown in Table 1. The average particle diameter (D50) of the raw material powder was measured by the method as described above using an LA-920 apparatus available from HORIBA, Ltd. The Pt—Ge alloy powder was obtained by pulverizing an ingot obtained by dissolving and casting Pt and Ge at an atomic ratio of 1:1 and sieving it through a sieve having a mesh opening size of 90 µm. Further, the Pt—Ge alloy powder was charged into a ball mill pot having a capacity of 10 liters together with SUS balls as a grinding medium, and rotated in an Ar atmosphere for 8 hours to mix and pulverize them. The average particle diameter (D50) of the Pt—Ge alloy powder after pulverizing was determined by the laser diffraction/scattering method. As a result, the average particle diameter was about 20 µm for any of the test examples. Further, the Pt—Ge—Fe alloy powder was obtained by the atomizing method so as to have a composition with an atomic ratio of Pt, Ge and Fe being 1:1:0.2. Furthermore, the atomized Pt—Ge—Fe alloy powder was charged into a ball mill pot having a capacity of 10 liters together with SUS balls as a grinding medium, and rotated in an Ar atmosphere for 8 hours to mix and pulverize them. The average particle diameter (D50) of the Pt—Ge—Fe alloy powder after pulverizing was determined by the laser diffraction/scattering method. As a result, the average particle diameter was about 20 µm for any of the test examples.

The volume fraction of the nonmagnetic material (C) was determined by calculating the mass ratio from the atomic ratio and the atomic weight of each element and using the mass ratio and the density of each element. For example, in the case of Example 1 and Comparative Example 1, assuming that the mass ratios of Fe, Pt, Ge and C were W1, W2, W3, and W4 (% by mass), respectively, and the densities of Fe, Pt, Ge and C were D1=7.874 (g/cm$^3$), D2=21.45 (g/cm$^3$), D3=5.323 (g/cm$^3$), D4=2.260 (g/cm$^3$), respectively, the mass ratios and the densities were assigned into the following equation to determine the volume fraction:

Volume Fraction (%) of C=(W4/D4)/(W1/D1+W2/D2+W3/D3+W4/D4)×100.

The weighed raw material powder was charged into a ball mill pot having a capacity of 10 liters together with SUS balls as a grinding medium and rotated for 4 hours in an Ar atmosphere to mix and pulverize them. The average particle diameter (D50) of the mixed powder after pulverizing was determined by the laser diffraction/scattering method. As a result, it was from about 1 to 5 μm for any of the test examples. Next, the powder taken out of the pot was filled into a carbon mold, and molded and sintered using a hot pressing machine. The hot pressing was carried out in a vacuum atmosphere at a heating temperature of 300° C./hours and at a retention temperature of 750° C. for a retention time of 2 hours under a gas pressure of 30 MPa from the start of the heating to the end of the temperature retention. After the end of the temperature retention, the sintered body was subjected to natural cooling within the chamber as it was. The sintered compact taken out of the hot pressing mold was then subjected to hot isostatic pressing and sintering (HIP). The hot isostatic pressing and sintering was carried out at a heating temperature of 300° C./hours and at a retention temperature of 750° C. for a retention time of 2 hours under a gas pressure of an Ar gas which was gradually increased from the start of the heating and which was at 150 MPa during the retention at 750° C. After the end of the temperature retention, the compact was subjected to natural cooling within the furnace as it was. Next, using a lathe, each sintered compact was cut into a shape having a diameter of 180.0 mm and a thickness of 5.0 mm to provide a disk-shaped sputtering target.

<$S_{Ge30mass\ \%}/S_{Ge}$>

A cross section perpendicular to the sputtering surface of the target according to each test example obtained by the above producing procedures was cut out by a fine cutter and polished by the above-mentioned polishing method to obtain a cross-section polished surface. The magnetic phases of the cross-section polished surface was subjected to element mapping using an EPMA (apparatus name: JXA-8500F, available from JEOL Ltd.) under the following conditions to examine an area ratio of the region having a Ge concentration of 30% by mass or more. The observation conditions for the EPMA were as follows: an acceleration voltage of 15 kV, and an irradiation current of $1 \times 10^{-7}$ to $2 \times 10^{-7}$ A; ten element mapping images with 256×256 pixels (measurement time at one point of 1 msec) were acquired with an observation magnification of 2500 in different observation fields of view. The total observation field area was 40 μm×40 μm×10 images=about 16000 μm². In the element mapping, monochrome or color images corresponding to X-ray detection intensity of specific elements are obtained. Therefore, the X-ray intensity map was converted to a mass concentration map by using an analysis function of a surface analysis software (version 1.42), which was a basic software attached to the EPMA. The conversion was carried out by using a calibration curve (linear function) that correlated the X-ray detection intensity with the element concentration prepared by measuring a standard pure sample of each element. Then, using the converted mass concentration map, the area ratio $S_{Ge30mass\ \%}$ (%) of the region having the Ge concentration of 30% by mass or more was determined for each field of view, and an average of 10 fields of view was calculated. Then, a ratio ($S_{Ge30mass\ \%}/S_{Ge}$) of the average ratio ($S_{Ge30mass\ \%}$) to the area ratio of Ge ($S_{Ge}$) obtained from results of the composition analysis of the target as described below was calculated. As with the calculation of the volume fraction, the area ratio of Ge ($S_{Ge}$) obtained from the results of the composition analysis was calculated by using the mass ratio and the density of each component of the target. For instance, in the case of Example 1 and Comparative Example 1, assuming that the mass ratios of Fe, Pt, Ge and C were W1, W2, W3, and W4 (% by mass), respectively, and the densities of Fe, Pt, Ge and C were D1=7.874 (g/cm³), D2=21.45 (g/cm³), D3=5.323 (g/cm³), D4=2.260 (g/cm³), the mass ratios and the densities were assigned into the following equation to determine the area ratio:

Area ratio of Ge (%) $S_{Ge}$=(W3/D3)/(W1/D1+W2/D2+W3/D3+W4/D4)×100.

It is herein utilized that the following relational expression is established between the average area ratio and the volume fraction of uniformly dispersed phases (Mitsuo SHINKE ed.: Foundation and Application of Organization/Characteristic Analysis of 3D Material, Appendix A1, UCHIDA ROKAKUHO PUBLISHING CO., LTD., June, 2014).

Average Area Ratio=Volume Fraction.

Table 1 shows the ratio ($S_{Ge30mass\ \%}/S_{Ge}$) of the average $S_{Ge30mass\ \%}$ to the $S_{Ge}$ thus determined.

<Composition Analysis>

For pieces cut out of the target according to each test example obtained by the above producing procedures, the oxygen concentration was measured by an oxygen analyzer (apparatus name TC 600) available from LECO CORPORATION, which adopted the inert gas fusion-infrared absorption method. The results are shown in Table 1.

The target according to each test example obtained by the above producing procedures was cut using the lathe to prepare cutting chips, which were subjected to composition analysis by an ICP-AES apparatus (available from Hitachi High-Tech Science Corporation (originally SII Corporation), apparatus name: SPS 3100 HV), confirming that the composition of each target was substantially the same as the weighed composition. Here, in order to improve the measurement accuracy, the metal composition analysis was carried out by drawing a calibration curve by the internal standard method.

<Relative Density>

The relative density was calculated from the actual density measured by the Archimedes method in water and the theoretical density for the target according to each test example obtained by the above producing procedures. The results are shown in Table 1.

<Film Formation Test>

The sputtering target according to each test example obtained by the above producing procedures was attached to a magnetron sputtering apparatus (C-3010 sputtering system available from CANON ANELVA CORPORATION), and sputtering was then carried out. The sputtering conditions were as follows: supplied power of 1 kW and an Ar gas pressure of 1.7 Pa; a film was formed on a silicon substrate for 20 seconds. The number of particles (particle diameter of from 0.25 to 3 μm) adhering to the substrate was measured using a particle counter (apparatus name: Surfscan 6420 available from KLA-Tencor Corporation). The results are shown in Table 1. The sputtering surface of the sputtering target after film formation was observed by SEM, indicating that substantially no nodule was observed for Examples 1 to 23, but the presence of nodules was observed for Comparative Example 1. After film formation, the thin film on the substrate was heated at 400° C. for 1 hour in a high vacuum furnace and then analyzed by XRD (X-ray diffraction method). As a result, the peak of the Fe—P ordered phase was confirmed for the thin film according to any of the test examples. Analysis conditions of the X-ray diffraction method were as follows:
Analyzer: a fully automated horizontal multi-purpose X-ray diffractometer Smart Lab available from Rigaku Corporation;
Tube: Cu (measured by CuKα);
Tube Voltage: 40 kV;
Tube Current: 30 mA;
Optical System: a focusing-type diffraction optical system;
Scan Mode: 2θ/θ;
Scanning Range (2θ): from 10° to 80°;
Measurement Step (2θ): 0.05°;
Scanning Speed (2θ): 0.5° per minute;
Attachment: standard attachment;
Filter: CuKβ filter;
Counter Monochrome: none;
Counter: D/teX Ultra;
Divergent Slit: ⅔ deg.;
Divergent Vertical Slit: 10.0 mm;
Scattering Slit: 10.0 mm;
Light Receiving Slit: 10.0 mm;
Attenuator: OPEN;
Angle (2θ) at which super lattice reflection peaks of FePt ordered phase appear:
24.0° (001), 32.8° (110);
Measured Sample Size: approximately 10 mm×10 mm.

The resulting XRD profile was analyzed using an integrated powder X-ray analysis software PDXL available from Rigaku Corporation. The resulting measurement data were subjected to BG removal, Kα₂ removal and peak search in automatic mode to extract diffraction peaks. The presence or absence of a peak in a range of ±0.5° of the diffraction peak angle from each of the (001) plane and the (110) plane was examined. When diffraction peaks were present in both ranges, the FePt film was determined to be ordered.

TABLE 1

|  |  | Example 1 | Comparative Example 1 | Example 2 | Example 3 | Example 4 | Example 5 |
|---|---|---|---|---|---|---|---|
| Average Particle Diameter of Raw Material Powder (μm) | Fe Powder | 5 | 5 | 5 | 5 | 5 | 5 |
|  | Pt-Ge powder | 20 | — | 20 | 20 | 20 | 20 |
|  | Pt-Ge-Fe Powder | — | — | — | — | — | — |
|  | Pt Powder | 2 | 2 | 2 | 2 | 2 | 2 |
|  | Other Metal Powder | — | Ge: 50 μm | — | — | — | — |
|  | C Powder | 15 | 15 | 15 | 15 | 15 | 15 |
| Weighed Composition (Atomic Ratio) | Fe | 27 | 27 | 35.1 | 24.3 | 28.5 | 24 |
|  | Pt | 27 | 27 | 18.9 | 29.7 | 28.5 | 24 |
|  | Ge | 6 | 6 | 6 | 6 | 3 | 12 |
|  | Other Metal Powder | — | — | — | — | — | — |
|  | C | 40 | 40 | 40 | 40 | 40 | 40 |
| Volume Fraction (%) of Nonmagnetic Material (C) |  | 29 | 29 | 30 | 29 | 30 | 28 |
| Oxygen Concentration (ppm by mass) |  | 320 | 680 | 390 | 350 | 270 | 380 |
| Magnetic Phase Composition (atomic ratio, excluding third element) | Fe | 45 | 45 | 58.5 | 40.5 | 47.5 | 40 |
|  | Pt | 45 | 45 | 31.5 | 49.5 | 47.5 | 40 |
|  | Ge | 10 | 10 | 10 | 10 | 5 | 20 |
|  | α | 0.5 | 0.5 | 0.35 | 0.55 | 0.5 | 0.5 |
|  | β | 0.1 | 0.1 | 0.1 | 0.1 | 0.05 | 0.2 |
| Proportion of Ge-based Alloy Phase ($S_{Ge30wt\%}/S_{Ge}$) |  | 0.21 | 0.67 | 0.18 | 0.15 | 0.21 | 0.12 |
| Relative Density (%) |  | 92.7 | 93.7 | 95.2 | 94.5 | 93.4 | 93 |
| Number of Particles |  | 278 | 645 | 283 | 277 | 254 | 282 |

|  |  | Example 6 | Example 7 | Example 8 | Example 9 | Example 10 | Example 11 |
|---|---|---|---|---|---|---|---|
| Average Particle Diameter of Raw Material Powder (um) | Fe Powder | 5 | 5 | 5 | 5 | 5 | 5 |
|  | Pt-Ge powder | 20 | 20 | 20 | 20 | 20 | 20 |
|  | Pt-Ge-Fe Powder | — | — | — | — | — | — |
|  | Pt Powder | 2 | 2 | 2 | 2 | 2 | 2 |
|  | Other Metal Powder | Au: 2 μm | B: 30 μm | Co: 5 μm | Cr: 5 μm | Cu: 2 μm | Mn: 30 μm |
|  | C Powder | 15 | 15 | 15 | 15 | 15 | 15 |
| Weighed Composition (Atomic Ratio) | Fe | 27 | 27 | 27 | 27 | 27 | 27 |
|  | Pt | 27 | 27 | 27 | 27 | 27 | 27 |
|  | Ge | 3 | 3 | 3 | 3 | 3 | 3 |
|  | Other Metal Powder | 3 | 3 | 3 | 3 | 3 | 3 |
|  | C | 40 | 40 | 40 | 40 | 40 | 40 |
| Volume Fraction (%) of Nonmagnetic Material (C) |  | 29 | 30 | 30 | 30 | 30 | 30 |
| Oxygen Concentration (ppm by mass) |  | 290 | 380 | 350 | 370 | 330 | 330 |
| Magnetic Phase Composition (atomic ratio, excluding third element) | Fe | 47.37 | 47.37 | 47.37 | 47.37 | 47.37 | 47.37 |
|  | Pt | 47.37 | 47.37 | 47.37 | 47.37 | 47.37 | 47.37 |
|  | Ge | 5.26 | 5.26 | 5.26 | 5.26 | 5.26 | 5.26 |
|  | α | 0.5 | 0.5 | 0.5 | 0.5 | 0.5 | 0.5 |
|  | β | 0.0526 | 0.0526 | 0.0526 | 0.0526 | 0.0526 | 0.0526 |
| Proportion of Ge-based Alloy Phase ($S_{Ge30wt\%}/S_{Ge}$) |  | 0.13 | 0.25 | 0.18 | 0.26 | 0.18 | 0.35 |
| Relative Density (%) |  | 92.8 | 95 | 93.5 | 95.6 | 93.5 | 94.1 |
| Number of Particles |  | 296 | 201 | 297 | 305 | 260 | 245 |

|  |  | Example 12 | Example 13 | Example 14 | Example 15 | Example 16 | Example 17 |
|---|---|---|---|---|---|---|---|
| Average Particle | Fe Powder | 5 | 5 | 5 | 5 | 5 | 5 |

TABLE 1-continued

|  |  | | | | | | |
|---|---|---|---|---|---|---|---|
| Diameter of Raw Material Powder (μm) | Pt-Ge powder | 20 | 20 | 20 | 20 | 20 | 20 |
|  | Pt-Ge-Fe Powder | — | — | — | — | — | — |
|  | Pt Powder | 2 | 2 | 2 | 2 | 2 | 2 |
|  | Other Metal Powder | Mo: 5μm | Nb: 20μm | Ni: 2μm | Pd: 1μm | Re: 30μm | Rh: 0.5μm |
|  | C Powder | 15 | 15 | 15 | 15 | 15 | 15 |
| Weighed Composition (Atomic Ratio) | Fe | 27 | 27 | 27 | 27 | 27 | 27 |
|  | Pt | 27 | 27 | 27 | 27 | 27 | 27 |
|  | Ge | 3 | 3 | 3 | 3 | 3 | 3 |
|  | Other Metal Powder | 3 | 3 | 3 | 3 | 3 | 3 |
|  | C | 40 | 40 | 40 | 40 | 40 | 40 |
| Volume Fraction (%) of Nonmagnetic Material (C) |  | 30 | 29 | 30 | 30 | 30 | 30 |
| Oxygen Concentration (ppm by mass) |  | 300 | 370 | 350 | 320 | 380 | 320 |
| Magnetic Phase Composition (atomic ratio, excluding third element) | Fe | 47.37 | 47.37 | 47.37 | 47.37 | 47.37 | 47.37 |
|  | Pt | 47.37 | 47.37 | 47.37 | 47.37 | 47.37 | 47.37 |
|  | Ge | 5.26 | 5.26 | 5.26 | 5.26 | 5.26 | 5.26 |
|  | α | 0.5 | 0.5 | 0.5 | 0.5 | 0.5 | 0.5 |
|  | β | 0.0526 | 0.0526 | 0.0526 | 0.0526 | 0.0526 | 0.0526 |
| Proportion of Ge-based Alloy Phase ($S_{Ge30wt\%}/S_{Ge}$) |  | 0.21 | 0.27 | 0.24 | 0.27 | 0.23 | 0.29 |
| Relative Density (%) |  | 94.7 | 92.1 | 92.8 | 93.7 | 93.6 | 92.5 |
| Number of Particles |  | 365 | 320 | 272 | 315 | 258 | 236 |

|  |  | Example 18 | Example 19 | Example 20 | Example 21 | Example 22 | Example 23 |
|---|---|---|---|---|---|---|---|
| Average Particle Diameter of Raw Material Powder (um) | Fe Powder | 5 | 5 | 5 | 5 | 5 | 5 |
|  | Pt-Ge powder | 20 | 20 | 20 | 20 | 20 | 20 |
|  | Pt-Ge-Fe Powder | — | — | — | — | — | — |
|  | Pt Powder | 2 | 2 | 2 | 2 | 2 | 2 |
|  | Other Metal Powder | Ru: 20 μm | Sn: 50 μm | Ta: 50 μm | W: 5 μm | V: 30 μm | Zn: 10 μm |
|  | C Powder | 15 | 15 | 15 | 15 | 15 | 15 |
| Weighed Composition (Atomic Ratio) | Fe | 27 | 27 | 27 | 27 | 27 | 27 |
|  | Pt | 27 | 27 | 27 | 27 | 27 | 27 |
|  | Ge | 3 | 3 | 3 | 3 | 3 | 3 |
|  | Other Metal Powder | 3 | 3 | 3 | 3 | 3 | 3 |
|  | C | 40 | 40 | 40 | 40 | 40 | 40 |
| Volume Fraction (%) of Nonmagnetic Material (C) |  | 30 | 29 | 29 | 30 | 30 | 30 |
| Oxygen Concentration (ppm by mass) |  | 370 | 300 | 350 | 290 | 370 | 340 |
| Magnetic Phase Composition (atomic ratio, excluding third element) | Fe | 47.37 | 47.37 | 47.37 | 47.37 | 47.37 | 47.37 |
|  | Pt | 47.37 | 47.37 | 47.37 | 47.37 | 47.37 | 47.37 |
|  | Ge | 5.26 | 5.26 | 5.26 | 5.26 | 5.26 | 5.26 |
|  | α | 0.5 | 0.5 | 0.5 | 0.5 | 0.5 | 0.5 |
|  | β | 0.0526 | 0.0526 | 0.0526 | 0.0526 | 0.0526 | 0.0526 |
| Proportion of Ge-based Alloy Phase ($S_{Ge30wt\%}/S_{Ge}$) |  | 0.25 | 0.28 | 0.16 | 0.27 | 0.24 | 0.14 |
| Relative Density (%) |  | 94.1 | 92.1 | 95.6 | 90.2 | 95.2 | 90.1 |
| Number of Particles |  | 342 | 270 | 363 | 290 | 210 | 290 |

|  |  | Example 24 | Example 25 |
|---|---|---|---|
| Average Particle Diameter of Raw Material Powder (um) | Fe Powder | 5 | 5 |
|  | Pt-Ge powder | — | — |
|  | Pt-Ge-Fe Powder | 20 | 20 |
|  | Pt Powder | 2 | 2 |
|  | Other Metal Powder | — | Au: 2 μm |
|  | C Powder | 15 | 15 |
| Weighed Composition (Atomic Ratio) | Fe | 27 | 27 |
|  | Pt | 27 | 27 |
|  | Ge | 6 | 3 |
|  | Other Metal Powder | — | 3 |
|  | C | 40 | 40 |
| Volume Fraction (%) of Nonmagnetic Material (C) |  | 29 | 29 |
| Oxygen Concentration (ppm by mass) |  | 270 | 340 |
| Magnetic Phase Composition (atomic ratio, excluding third element) | Fe | 45 | 47.37 |
|  | Pt | 45 | 47.37 |
|  | Ge | 10 | 5.26 |
|  | α | 0.5 | 0.5 |
|  | β | 0.1 | 0.0526 |
| Proportion of Ge-based Alloy Phase ($S_{Ge30wt\%}/S_{Ge}$) |  | 0.13 | 0.15 |
| Relative Density (%) |  | 94.6 | 93.8 |
| Number of Particles |  | 327 | 356 |

What is claimed is:

1. A nonmagnetic material-dispersed sintered sputtering target containing Fe, Pt, and Ge, the sputtering target comprising a nonmagnetic material dispersed in the sputtering target, and at least one magnetic phase satisfying a composition represented by $(Fe_{1-\alpha}Pt_\alpha)_{1-\beta}Ge_\beta$ in an atomic ratio for Fe, Pt, and Ge, in which α and β represent numbers meeting 0.35≤α≤0.55 and 0.05≤β≤0.2, respectively; wherein a raw material of Ge is Ge—Pt alloy powder and/or Pt—Ge—Fe alloy powder and wherein the at least one magnetic phase satisfies a ratio ($S_{Ge30mass\%}/S_{Ge}$) of 0.13 to 0.35, the ratio ($S_{Ge30mass\%}/S_{Ge}$) being a proportion of an average area ratio of Ge-based alloy phases containing Ge at a concentration of 30% by mass or more ($S_{Ge30mass\%}$) to an area ratio of Ge ($S_{Ge}$) calculated from an entire composition of the sputtering target, in element mapping by EPMA of a polished surface obtained by polishing a cross section perpendicular to a sputtering surface of the sputtering target;

wherein the nonmagnetic material dispersed in the sputtering target consists of carbon, wherein a raw material of said carbon is carbon powder; and, wherein the sputtering target comprises at least one third element selected from the group consisting of Au, B, Co, Cr, Cu, Mn, Mo, Nb, Ni, Pd, Re, Rh, Ru, Sn, Ta, W, V, and Zn, in an amount of 10 at. % or less as expressed by a ratio of a total number of atoms of the at least one third element to a total number of atoms of Fe, Ge, and Pt, wherein a raw material of each third element is a metal powder.

2. The sputtering target according to claim 1, wherein the nonmagnetic material accounts for a volume fraction of from 10 vol % to 60 vol % based on a total volume of the sputtering target.

3. The sputtering target according to claim 1, wherein the sputtering target has an oxygen concentration of 400 ppm by mass or less.

4. A method for producing the sputtering target according to claim 1, comprising steps of:

mixing Pt—Ge alloy powder and/or Pt—Ge—Fe alloy powder, metal powder other than the Pt—Ge alloy powder and the Pt—Ge—Fe alloy powder comprising at least one third element selected from the group consisting of Au, B, Co, Cr, Cu, Mn, Mo, Nb, Ni, Pd, Re, Rh, Ru, Sn, Ta, W, V, and Zn, in an amount of 10 at. % or less as expressed by a ratio of a total number of atoms of the at least one third element to a total number of atoms of Fe, Ge, and Pt, and nonmagnetic material powder consisting of carbon, while pulverizing said powders in an inert gas atmosphere to obtain a mixed powder, such that Fe, Pt, and Ge satisfy a composition represented by $(Fe_{1-\alpha}Pt_\alpha)_{1-\beta}Ge_\beta$ in an atomic ratio for Fe, Pt, and Ge, in which α and β represent numbers meeting 0.13≤α≤0.55 and 0.05≤β≤0.2, respectively;

sintering the mixed powder obtained in the above step by a pressure sintering method at a temperature of less than a melting point of the Pt—Ge alloy powder in a vacuum atmosphere or an inert gas atmosphere to obtain a sintered compact; and shaping the sintered compact.

5. The method for producing the sputtering target according to claim 4, wherein the Pt—Ge alloy powder and/or Pt—Ge—Fe alloy powder has an average particle diameter of from 1 μm to 50 μm before the mixing step.

6. The method for producing the sputtering target according to claim 4, wherein when using the Pt—Ge alloy powder, the Pt—Ge alloy powder before the mixing step comprises a composition Pt:Ge=1:0.8 to 1.2 in an atomic ratio.

7. The method for producing the sputtering target according to claim 4, wherein when using the Pt—Ge—Fe alloy powder, the Pt—Ge—Fe alloy powder before the mixing step comprises a composition Pt:Ge:Fe=1:0.8 to 1.2:0.1 to 0.3 in an atomic ratio.

8. The method for producing the sputtering target according to claim 4, wherein the method comprises pressurizing the mixed powder at a pressure in a range of from 20 MPa to 70 MPa during the sintering.

9. The method for producing the sputtering target according to claim 4, wherein the mixed powder obtained by the step of mixing the powders while pulverizing them has an average particle diameter of 20 μm or less.

* * * * *